United States Patent [19]

Shore et al.

[11] 3,763,402

[45] Oct. 2, 1973

[54] FLUID COOLED RECTIFIER HOLDING ASSEMBLY

[75] Inventors: Arnold I. Shore, Philadelphia; John Talentinow, Thornton, both of Pa.

[73] Assignee: General Electric Company, Philadelphia, Pa.

[22] Filed: Nov. 9, 1970

[21] Appl. No.: 88,056

[52] U.S. Cl. ..... 317/234 R, 317/234 A, 317/234 B, 317/234 N, 317/234 P

[51] Int. Cl. .......................... H01l 3/00, H01l 5/00

[58] Field of Search ...................... 317/234, 235, 1, 317/1.5, 4, 4.1, 5.4, 6; 165/80; 321/8; 29/583

[56] References Cited

UNITED STATES PATENTS

| | | | |
|---|---|---|---|
| 3,471,757 | 10/1969 | Sias | 317/234 |
| 3,238,425 | 3/1966 | Geyer | 317/234 |
| 3,280,389 | 10/1966 | Martin | 317/234 |
| 3,293,508 | 12/1966 | Boyer | 317/234 |
| 3,364,987 | 1/1968 | Bylund et al. | 317/234 |
| 3,551,758 | 12/1970 | Ferree | 317/234 |
| 3,573,574 | 4/1971 | Davis | 317/234 |

FOREIGN PATENTS OR APPLICATIONS

| | | | |
|---|---|---|---|
| 1,514,679 | 6/1969 | Germany | 317/234 B |
| 1,912,041 | 9/1969 | Germany | 317/234 |

OTHER PUBLICATIONS

Investigation of Heat Removal from High Current Thyristors; Siemens Journal by Paul Fries Dec. 1965.

*Primary Examiner*—John W. Huckert
*Assistant Examiner*—Andrew J. James
*Attorney*—J. Wesley Haubner, Frank L. Neuhauser, Oscar B. Waddell, Joseph B. Forman and Albert S. Richardson

[57] ABSTRACT

Disclosed is a cooled pressure assembly for applying clamping pressure to a plurality of semiconductor rectifiers and for electrically connecting them in parallel. The pressure is applied via a pair of heat dissipating electrodes disposed on opposite sides of the rectifiers. Each electrode contains a plurality of heat dissipating fins which make up a plurality of cooling fluid ducts immediately adjacent the rectifiers. Clamping force exciting means are provided to center the clamping forces axially on the rectifiers and to apply them through the electrodes and the fins therein contained to the rectifiers.

7 Claims, 4 Drawing Figures

Patented Oct. 2, 1973 3,763,402

2 Sheets-Sheet 1

INVENTORS:
ARNOLD I. SHORE,
JOHN TALENTINOW,
BY Barry A. Stein
ATTORNEY

INVENTORS:
ARNOLD I. SHORE,
JOHN TALENTINOW,
BY Barry A. Stein
ATTORNEY

FLUID COOLED RECTIFIER HOLDING ASSEMBLY

BACKGROUND AND OBJECTS OF THE INVENTION

This invention relates to semiconductor rectifier assemblies, and more particularly it relates to such assemblies wherein a plurality of high current semiconductor devices are jointly mounted in compression.

Various technqiues have heretofore been proposed for mounting broad area high current semiconductor rectifiers under pressure in heat dissipating assemblies. Such rectifiers are commonly constructed with a broad area semiconductor wafer, having at least one P-N rectifying junction, hermetically sealed in a housing including a ceramic sleeve and a pair of conductive contact terminals which contact the wafer and cap the respective ends of the sleeve. Such rectifiers are held or clamped together by the application of high pressure to their terminal members and no solder or other bonding means are utilized.

In operation the passage of current through the rectifier junctions(s) results in the generation of heat therein. Further, the contact resistance between the wafer and the terminals cause the generation of heat upon the passage of current therethrough. Since the current handling capability of a rectifier is temperature limited it is important to keep the contact resistance at a minimum while efficiently extracting the heat that is generated. In order to accomplish those ends rectifier-holding, heat dissipating assemblies have been constructed with means for applying high pressure evenly over the entire rectifier wafer area to reduce the contact resistance and with heat dissipating elements or fins for radiating the heat which the rectifier generates into a cooling fluid medium. See for example U.S. Pats. Nos. 3,280,389 (Martin) and 3,471,757 (Sias).

As is seen in these patents it is common practice to include more than one rectifier in the assembly to increase its voltage and/or current handling capability.

In the prior art assemblies the heat dissipating elements (fins) are disposed relatively remote from the rectifier due to the fact that massive pressure applying means are included in the thermal path between the heat producing rectifier and the heat dissipating fins. The result of this construction is that the heat dissipating capabilities of those assemblies may in some cases be less than desired. Accordingly, one of our general objectives is to provide improved pressure assemblies of high current semiconductor devices in which the short comings of the prior art are sustantially avoided.

Another general object of the present invention is the provision of a semiconductor rectifier pressure assembly utilizing a simple, rugged construction with heat dissipating means in intimate relationship with the rectifier.

Another general object is the provision of a semiconductor rectifier pressure assembly in which a plurality of individual semiconductor rectifiers are tightly and uniformly compressed between intimate heat dissipating means.

SUMMARY OF THE INVENTION

In carrying out our invention in one form, we provide a semiconductor rectifier pressure assembly for applying clamping pressure to a plurality of semiconductor rectifiers oriented with their axes parallel to one another. The clamping pressure is applied by a pair of opposed heat dissipating electrodes comprising: a first member having a planar contact surface, a second member and a plurality of force transmitting heat dissipating fins connected therebetween and making heat conductive engagement with said first member. The rectifiers are disposed between the opposed heat dissipating electrodes with their anode terminals in intimate heat engagement with a planar contact surface of one of said electrodes and with their cathode terminals in intimate heat engagement with a planar contact surface of the other of said electrodes.

In order for the heat dissipating electrodes to apply clamping pressure to the rectifiers, clamping means are provided which apply a clamping force to the heat dissipating electrodes at points on their second members which are coaxial with the rectifiers. This force is transmitted through those members, the heat dissipating fins and the first planar members to the rectifier terminals. The clamping means may comprise a two ended tension member extending between and parallel to the axes of the rectifiers and through the heat dissipating electrodes. Disposed at each end of the tension member is a resilient member adapted for contacting said second members at said coaxial points.

The effect of the above construction is that the rectifier devices are evenly clamped between the heat dissipating electrodes in a simple, yet rugged construction, which is effectively cooled by the passage of cooling fluid through cooling fluid ducts disposed intimately with said devices.

BRIEF DESCRIPTION OF THE DRAWINGS

Our invention will be better understood and its various objects and advantages will be more fully appreciated from the following description taken in conjunction with the accompanying drawings in which.

DETAILED DESCRIPTION OF PREFERRED EMBODIMENTS

Some of the features shown and described herein form the subject matters of copending patent applications Ser. No. 111,237-Eriksson et al (now U.S. Pat. No. 3,652,903) and Ser. No. 163,660-Livezey et al (now U.S. Pat. No. 3,686,541), both assigned to the General Electric Co.

Figure 1:
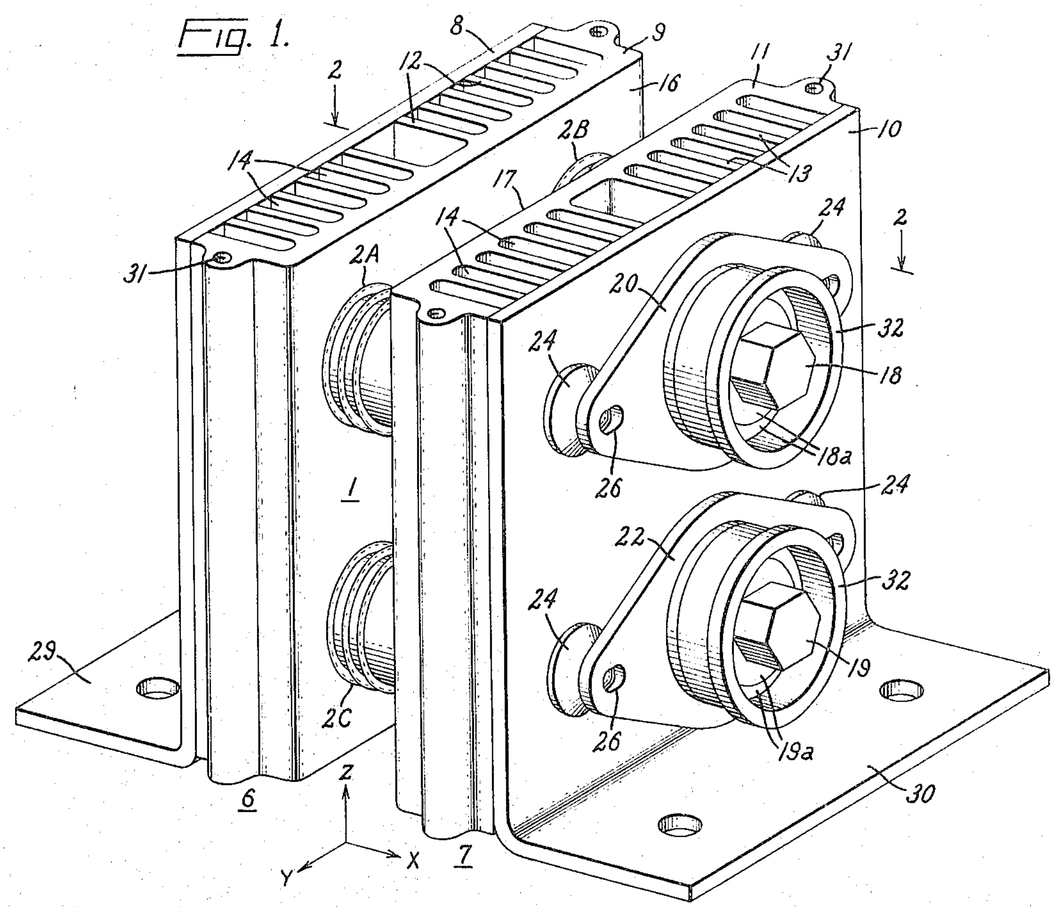
FIG. 1 is a perspective view of a semiconductor rectifier pressure assembly in accordance with our invention.

Insofar as our invention is concerned, FIG. 1 shows a pressure assembly holding four high current semiconductor rectifier devices each of which may be of the style shown on pages 349–351 of the General Electric SCR Manual 4th Edition (1967). The individual rectifier devices are electrically and mechanically connected in parallel in the assembly to provide a very high current handling capability. Further, the rectifiers mounted in one pressure assembly may be electrically connected in series with those in other similar assemblies for connection in a high power electrical system. For example, plural interconnected assemblies may be used to form a high voltage valve suitable for connection with other valves to form a bridge circuit for a High Voltage Direct Current (HVDC) system.

In order to maintain operating integrity of the rectifier devices in such a system, cooling means are preferably provided to extract the heat generated by the devices during their operation. In a copending patent Ser. No. 99,893 filed on Dec. 21, 1970, now U.S. Pat. No. 3,663,400 assigned to the General Electric Co. (now U.S. Pat. No. 3,646,400-Demarest et al), there is disclosed an air cooling system for a HVDC valve in which cooling air is driven through a housing containing a plurality of rectifier-holding pressure assemblies such as those herein disclosed. That system is arranged so that cooling air is enabled, as the result of high back pressure, to pass equally through cooling passages in the pressure assemblies making up the valve, in order to extract the heat generated by the rectifier devices contained therein.

In order to cool the individual rectifiers most efficiently we have found that it is preferable to utilize the passage of high velocity, turbulent air through cooling ducts which are arranged in intimate relationship with those rectifiers. Accordingly, our assembly is designed so that narrow, turbulence-creating cooling ducts are in close proximity with the rectifier devices to provide effective large area cooling surfaces immediately adjacent thereto.

Figure 2:
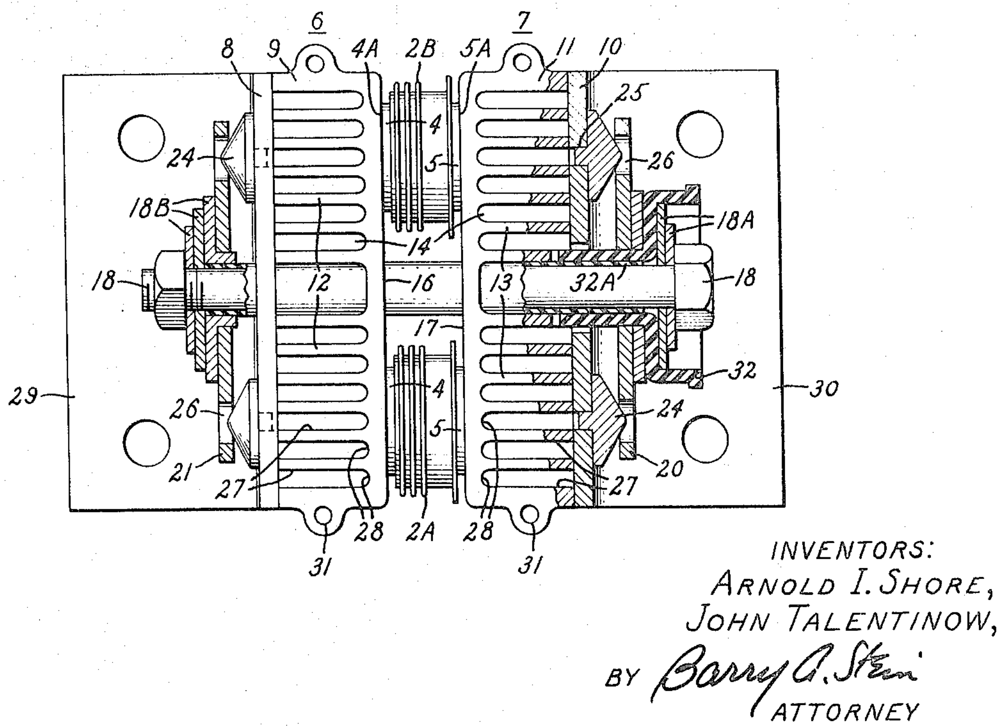
FIG. 2 is a partial cross sectional view along line 2—2 of FIG. 1.
Figure 3:
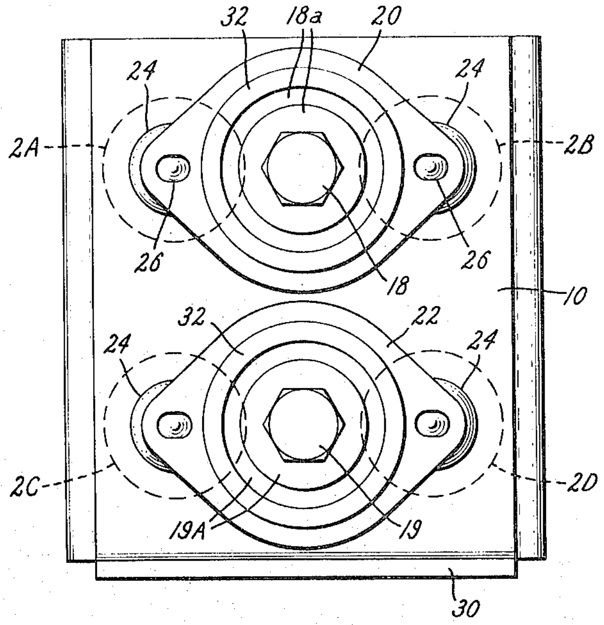
FIG. 3 is an end view of FIG. 1.

As shown in FIGS. 1–3 pressure assembly 1 forms four high current semiconductor rectifier devices, namely, 2A, 2B, 2C and 2D. The devices are oriented so that their axes are parallel to one another. Each device comprises a broad area disk-like semiconductor wafer (not shown) having at least one P-N rectifying junction disposed in a ceramic sleeve and sandwiched between a pair of terminals 4 and 5. Each terminal has a relatively flat external contact surface which is perpendicular to the axis of the device. Terminal 4 and its associated contact surface 4A form the anode of the rectifier while terminal 5 and its associated contact surface 5A forms the cathode.

The devices shown in FIGS. 1–3 may be either diodes or thyristors (i.e., controlled rectifiers) depending upon the function to be performed. If the devices are thyristors the wafers are characterized by four layers of silicon of alternately P and N type conductivity, one of which has a gate contact which is connected to an external gate lead (not shown).

Each device is disposed mechanically between and connected electrically in series with a pair of opposed heat dissipating electrodes 6 and 7 which serve as combined electrical and thermal conductors. Towards this end these electrodes are made of a conductive metal such as aluminum. Electrode 6 includes a pair of planar members 8 and 9. Sandwiched between these members are a plurality of force transmitting heat dissipating elements or fins 12 which may be integral with member 9, or may be integral with both members 8 and 9 if desired. Similarly, contact electrode 7 includes a pair of planar members 10 and 11 and a plurality of force transmitting heat dissipating fins 13 therebetween which may be integral with members 10 and 11 if desired. In operation the surfaces of the heat dissipating elements will radiate the rectifier generated heat into a cooling medium. Preferably member 9 and its associated fins 12 are formed from an integral aluminum extrusion, as is member 11 and its associated fins 13. Regardless of whether or not the fins are integral with the planar members they are in intimate heat and electrical engagement therewith. The fins are relatively stubby (e.g., ⅛ inch thick and 1¼ inches high) and are disposed close to one another (e.g., ¼ inch apart) to form a plurality of narrow cooling fluid ducts or passages 14 which extend for a short distance (e.g., seven inches) in a direction perpendicular to the axes of the rectifiers. It will be observed that the thickness of each fin is only one-half the width of each cooling duct, and thus the total cross-sectional area of the fins is substantially less than that of the ducts therebetween.

The anode, cathode and semiconductor wafer of each rectifier device are conductively coupled by pressing their contiguous surfaces together under high pressure. This is accomplished by mounting the devices under pressure between the electrodes 6 and 7. Toward that end planar member 9 includes a relatively planar or flat side 16 which is generally parallel to the contact surfaces of all of the rectifiers and is adapted to abut in intimate heat and electrical engagement the anode contact surfaces of all of the rectifiers. Planar member 11 includes a relatively planar or flat side 17 similarly oriented and adapted to abut in intimate heat and electrical engagement their cathode contact surfaces. No solder or other means is used for bonding the rectifier parts and the contact electrodes together and the contact electrodes are completely separable from the rectifiers. Nevertheless, good electrical and thermal conductivity at the junctions of these parts is obtained in our assembly by subjecting the contact electrodes to high force (e.g., 8000 pounds) distributed evenly over the devices. In order to insure that even distribution of pressure exists over the whole wafer area of each of the parallel connected rectifiers, means are provided for directing the clamping force axially on each rectifier. The means for providing this function may include a single tie bolt-belleville washer configuration like that shown in FIG. 5 in the previously noted Sias patent. However, in the preferred embodiments shown herein a different configuration is used. The reasons for the instant construction are explained fully in the previously mentioned copending application of Eriksson et al. As can be seen in FIG. 2 a central tension member or tie bolt 18 is provided to extend between rectifiers 2A and 2B parallel to and in the plane of their axes. A similarly constructed and disposed tie bolt 19 is provided between rectifiers 2C and 2D. Coupled to respective ends of tie bolt 18, via respective washers 18A and 18B, are resilient members or leaf springs 20 and 21. Similar leaf springs 22 and 23 are coupled to the ends of tie bolt 19 via respective washers 19A and 19B. The function of the leaf springs is springs is transmit a compressive force, which is generated by tightening the tie bolts, to the heat dissipating electrodes, which in turn transfer it to the rectifiers sandwiched therebetween. In order to insure that the compressive force is applied axially on the rectifiers, conical pressure spreading members 24 are disposed coaxially therewith. These members are held in position in restraining holes 25 of planar members 8 and 10. The conical members are adapted to sit in and to coact with elongated slots 26 which are provided in each leaf spring. The slots in each spring are oriented so that their major axis lies along the straight line connecting them. Therefore, upon tightening of their associated tie bolts, the compressive force from the springs thereon will be applied to portions of the heat dissipating electrodes centered over the axes of the sandwiched rectifiers, notwithstanding the fact that the slots would have moved relative to the conical member seated therein as a result of the springs' flexure as the bolts are tightened. Conical members 24 are provided with relatively large bases so that the compressive force from the leaf spring is spread out over a portion of planar members 8 and 10. This insures that the applied force, although centered coaxially on the rectifiers, is nevertheless transferred to those rectifiers via a plurality of the stubby heat dissipating fins and the planar members. In so doing the clamping force will be equalized across the anode and cathode contact surfaces of the clamped rectifiers. Further, planar members 9 and 11 are relatively thin so as to afford some flexibility about the Z axis (this axis is shown in FIG. 1). The ability to flex in this manner insures that the same amount of pressure that is applied to rectifier 2A is applied to rectifier 2B and that the same amount of pressure that is applied to rectifier 2C is applied to rectifier 2D, even if any rectifier's contact surface is not perfectly flat or if either planar surfaces 16 or 17 are not perfectly flat. Accordingly, surfaces 16 and 17 need not be machined flat to close tolerances.

By utilizing the heat dissipating fins as a means for transmitting the clamping pressure to the sandwiched rectifiers we are able to provide large cooling surfaces immediately adjacent the contact surfaces of the rectifiers. As can be seen in FIG. 2 there are relatively large cooling surfaces 27 and 28 immediately adjacent anode 4 and cathode 5, which surfaces are available for extracting the heat generated by the rectifiers during operation. Further, as was previously noted the closely spaced fins create narrow cooling ducts or passages through which air may be passed at high velocities. The passage of such air through the narrow cooling ducts results in some air turbulence therein. As will be appreciated by those skilled in the art, high velocity-turbulent-air is quite effective in extracting heat from a hot body, in that the insulating layer of air which normally exists immediately adjacent that body is scrubbed away by the turbulence. Therefore, it should be appreciated that the construction of our heat dissipating electrodes, with narrow cooling ducts immediately adjacent the rectifier electrodes, serve to effectively extract the heat generated by the rectifiers during their operation. For example, in a pressure assembly constructed in accordance with FIG. 1 in which the ducts were seven inches long, ¼ inch thick and 1¼ inches high and through which 360 c.f.m. of 95° F. air was passed at a velocity of 90 ft./sec. and at a back pressure of 3.2 inches of water column, 960 watts was dissipated.

Anode end electrode 6 of assembly 1 is suited for electrical connection to other assemblies in the HVDC valve via terminal connector 29 while cathode end electrode 7 is suited for connection to other asemblies via terminal connector 30. The entire pressure assembly 1 may be mounted in an insulating housing, like that disclosed in copending application Ser. No. 111,314 filed on Feb. 1, 1971 (not U.S. Pat. No. 3,684,943-Damarest et al), by bolting the assembly to the housing via holes 31.

Since electrode 6 is electrically connected to the anode of the rectifier assembly while electrode 7 is electrically connected to the cathode and since tie bolts 18 and 19 pass through both of these electrodes, each tie bolt is insulated from one electrode to prevent a short circuit. For example, tie bolt 18, as shown in FIG. 2, is electrically connected to the anode of the rectifiers via the electrode 6, conical members 24, spring 21 and washers 18B. To insulate this tie bolt from the cathode contact electrode an insulating sleeve 32 is provided about that tie bolt where it passes through the electrodes. To insulate the bolt from the cathode electrode outside of that electrode an insulating cup 32 is provided disposed between washers 18A and spring 20. A similar insulating sleeve and cup is disposed about tie bolt 19.

In electrical operation, current flows into terminal 29 through planar member 8, fins 12 and planar member 9 to the anodes of rectifiers 2A, 2B, 2C and 2D, through them to their cathodes and from there through planar member 11, fins 13 and planar member 10 to terminal 30. It should be noted that the current flows through the fins which serve to radiate any heat generated thereby.

While it is possible to utilize one tie bolt and its associated springs to apply clamping pressure to rectifiers 2A and 2C and utilize another tie bolt and its associated springs to apply clamping pressure to rectifiers 2B and 2D, such a construction scheme is not preferred. In order to clamp the rectifiers in that manner, tie bolt 18 would have to be relocated between rectifiers 2A and 2C while tie bolt 19 would have to be relocated between rectifiers 2B and 2D. Such a construction would have two drawbacks, namely, (1) the tie bolts would block the cooling passages passing directly over the rectifiers and (2) machining of contact surfaces 16 and 17 would be required to insure that they are extremely flat so that they apply equal pressure to the rectifiers sandwiched therebetween, since the contact electrodes are relatively inflexible about the Y axis (this axis is shown in FIG. 1).

Figure 4:
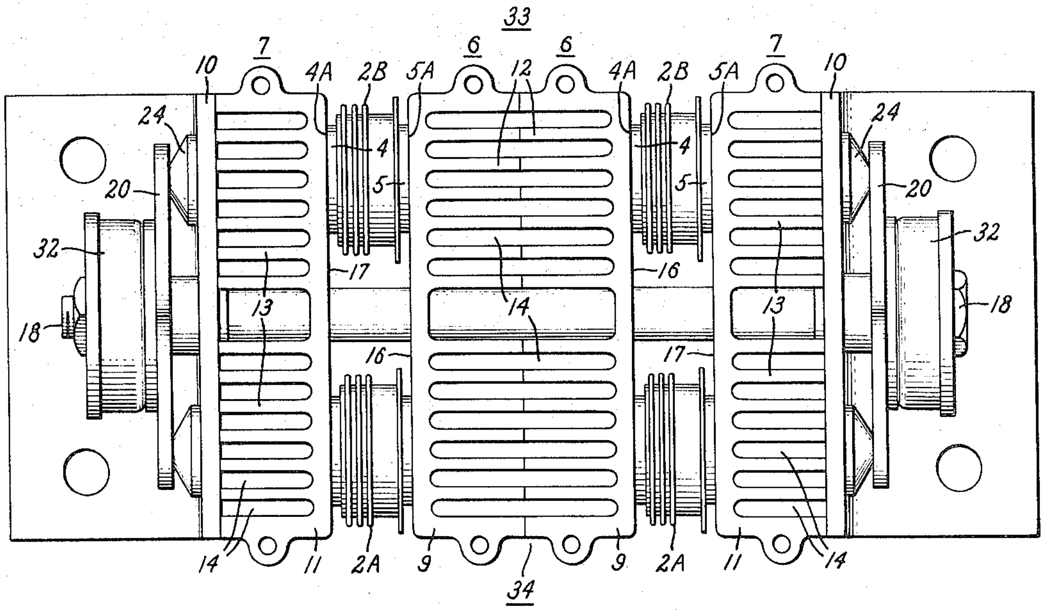
FIG. 4 is a plan view of another pressure assembly in accordance with our invention.

FIG. 4 shows another pressure assembly 33 in accordance with our invention. This assembly is adapted for higher voltage applications than the assembly shown in FIGS. 1–3 since it contains two rectifiers in series in each of the parallel paths. As should be appreciated assembly 33 can be constructed by using two of the pressure assemblies shown in FIG. 1. In that regard planar member 8, its conical members 24, springs 21 and 23 and washers 18B are removed from one assembly of FIG. 1 while the corresponding parts of another like assembly are also removed. The tie bolts 18 and 19 are extended to accommodate two modified assemblies 1 therebetween. These assemblies are connected to one another with the fins, 12, of one heat dissipating electrode 6 abutting like fins, 12, of the other heat dissipating electrode 6. The combination of these two contact electrodes creates an intermediate heat dissipating electrode 34. If the rectifiers are oriented so that their polarities are in the same direction an electrical assembly 33 is provided which is equivalent to two of the assemblies shown in FIG. 1 connected in series. Electrode 34 is at an electrical potential intermediate the anode and cathode potentials. In order to insure against any accidental short circuit or arcing in such a configuration, tie bolts 18 and 19 are electrically connected to intermediate electrode 34 so as to be at a potential intermediate the anode or cathode electrodes through which they pass.

Assembly 34 has wide electrical utility in that it can also be connected to form an AC switch by merely electrically connecting electrodes 7 together to form one side of the switch while using intermediate electrode 34 to form the other side of the switch. In such an arrangement insulator cups 32A would be unnecesasry.

For even higher voltage applications more than two pressure assemblies 1 can be combined to form a modified pressure assembly. Further, either assembly 1 or assembly 34 can be modified for lower current handling capabilities by utilizing dummy devices in lieu of some of the semiconductor rectifiers 2A–2D. For example, assembly 1 can be utilized for lower current applications by replacing rectifier 2B with a dummy device (i.e., a device which is of the same axial dimension as a rectifier device but which does not conduct current). Any combination of semiconductor rectifiers and dummy devices can be used as desired.

It should also be appreciated that assemblies 1 and 34 can also be modified for lower current applications by merely utilizing only a single pair of parallel rectifiers and a single tie bolt-leaf spring assembly. Such a construction could utilize shorter heat dissipating electrodes.

While we have shown and described particular embodiments of our invention, it will be obvious to those skilled in the art that various changes and modifications may be made without departing from our invention in its broader aspects; and we, therefore, intend herein to cover all such changes and modifications as fall within the true spirit and scope of our invention.

What I claim and desire to secure by Letters Patent of the United States is:

1. In a semiconductor rectifier assembly adapted for connection in a high power electrical system:

a. at least one semiconductor rectifier device including a semiconductor body in a sealed housing between a pair of main electrodes having external first and second contact surfaces on opposite sides of the housing, said surfaces being disposed parallel to each other and normal to the axis of said device;

b. means for mounting said device with its main electrodes held under high clamping pressure, said mounting means including at least one heat dissipating electrode abutting the first contact surface of the device and first electrically conductive means abutting the second contact surface of the device, said heat dissipating electrode comprising: an electrically conductive planar member having a planar surface disposed generally parallel to and abutting said first contact surface; another electrically conductive member having means for connecting the heat dissipating electrode to said power system; and a plurality of electrically conductive force transmitting heat radiating elements extending in parallel with one another between said members and in intimate heat and electrical engagement with said members, said elements and said members forming a pluraltiy of parallel cooling fluid passages disposed immediately adjacent said planar surface and c. force applying means for applying a clamping force to said heat dissipating electrode and to said first electrically conductive means to force the planar surface of said electrode into intimate heat and electrical engagement with said first contact surface and to force the first electrically conductive means into intimate electrical engagement with said second contact surface, said clamping force being transmitted through said heat dissipating electrode via both of said members and the heat dissipating elements and coaxial with the rectifier device so that only axial rectifier clamping pressure results.

2. The semiconductor rectifier assembly as specified in claim 1 wherein said first electrically conductive means is a second heat dissipating electrode comprising a first electrically conductive planar member having a planar surface disposed generally parallel to and abutting said second contact surface, a second electrically conductive member having means for connecting said second heat dissipating electrode to said power system, and a plurality of force transmitting heat radiating elements extending in parallel with one another between said first and second members and in intimate heat and electrical engagement with said members, said elements and said members forming a plurality of parallel cooling fluid passages disposed immediately adjacent the planar surface of said first member; and wherein said force applying means forces the planar surface of said first member into intimate heat and electrical engagement with said second contact surface.

3. In a semiconductor rectifier assembly adapted for connection in a high power electrical system:

a. a pair of semiconductor rectifier devices each including a semiconductor body in a sealed housing between a pair of main electrodes having external first and second contact surfaces on opposite sides of the housing, the axes of said devices being disposed parallel to one another and said contact surfaces being disposed parallel to each other and normal to the axes of said devices;

b. means for mounting said devices with their main electrodes held under high clamping pressure, said mounting means comprising: a pair of heat dissipating electrodes disposed on opposite sides of said devices for transmitting a high clamping pressure thereto, each of said heat dissipating electrodes comprising: a first electrically conductive planar member having at least one planar surface disposed generally parallel to and abutting said contact surfaces; a second electrically conductive member adapted to be connected to said power system; and a plurality of electrically conductive force transmitting-heat dissipating fins disposed between and connected to said members and in intimate heat and electrical engagement with said first member, said fins and said members being arranged to form a plurality of parallel cooling fluid passages disposed immediately adjacent said planar surface; and c. force applying means for applying a clamping force to said opposed heat dissipating electrodes to force the planar surface of one of said electrodes into intimate heat and electrical engagement with the first contact surfaces of said devices and to force the planar surface of the other of said electrodes into intimate heat and electrical engagement with the second contact surfaces of said devices, said clamping force being transmitted through said first and second members and the heat dissipating fins and coaxial with the rectifier devices so that only axial rectifier clamping results.

4. The assembly as specified in claim 3 wherein said force applying means comprises: a two ended tension member passing through said heat dissipating electrodes and extending centrally among and parallel to the axes of said devices, first resilient means disposed between one end of the tension member and selected points on the second member of one heat dissipating electrode, said selected points lying on the axes of said devices; and second resilient means disposed between the other end of the tension member and selected points on the second member of the other heat dissipating electrode, said selected points lying on the axes of said devices.

5. The assembly as specified in claim 4 wherein said tension member comprises an elongated tie bolt electrically insulated from one of said heat dissipating electrodes and wherein said resilient means are leaf springs.

6. In a semiconductor rectifier assembly adapted for connection in a high power electrical system:

a. first and second semiconductor rectifier devices each including a semiconductor body in a sealed housing between a pair of main electrodes having external first and second contact surfaces on opposite sides of the housing, said devices being disposed coaxially with one another and said surfaces being disposed parallel to each other and normal to the axes of said devices, the first contact surface of the second device being disposed adjacent the second contact surface of the first device;

b. means for mounting said devices with their main electrodes held under high clamping pressure, said mounting means comprising:

i. a pair of heat dissipating electrodes, one electrode being disposed adjacent the first contact surface of the first device and one electrode body being disposed adjacent the second contact surface of the second device, each of said heat dissipating electrodes comprising: a first electrically conductive planar member having at least one planar surface disposed generally parallel to and abutting said contact surfaces; a second electrically conductive member adapted to be connected to said power system; and a plurality of electrically conductive force transmitting heat dissipating fins disposed between and connected to said members and in intimate heat and electrical engagement with said first member, said fins and said members being arranged to form a plurality of parallel cooling fluid passages immediately adjacent said planar surface;

ii. a third heat dissipating electrode disposed between said devices comprising: a third electrically conductive planar member having at least one planar surface disposed generally parallel to and abutting the second contact surface of said first device; a fourth electrically conductive planar member having at least one planar surface disposed generally parallel to and abutting the first contact surface of said second device; and a plurality of electrically conductive force transmitting heat dissipating fins disposed between and connected in intimate heat and electrical engagement with said third and fourth members to form a plurality of parallel cooling fluid passages, and c. force applying means for applying a clamping force to said heat dissipating electrodes to force the planar surfaces and the abutting contact surfaces into intimate heat and electrical engagement with one another, said clamping force being transmitted through all of said members and the heat dissipating fins and coaxial with the devices so that only axial clamping pressure results.

7. The semiconductor rectifier assembly of claim 1 wherein the cross-sectional area of said plurality of elements is substantially less than the cross-sectional area of said plurality of cooling fluid passages.

* * * * *